(12) United States Patent
Mazza et al.

(10) Patent No.: US 12,438,078 B2
(45) Date of Patent: Oct. 7, 2025

(54) LOCAL INTERCONNECT POWER RAILS AND UPPER POWER RAILS

(71) Applicant: GLOBALFOUNDRIES U.S. Inc., Malta, NY (US)

(72) Inventors: James P. Mazza, Saratoga Springs, NY (US); Navneet K. Jain, Milpitas, CA (US); Xuelian Zhu, San Jose, CA (US); Jia Zeng, Sunnyvale, CA (US); Mahbub Rashed, Cupertino, CA (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 705 days.

(21) Appl. No.: 17/723,888

(22) Filed: Apr. 19, 2022

(65) Prior Publication Data
US 2023/0335484 A1    Oct. 19, 2023

(51) Int. Cl.
| | | |
|---|---|---|
| *H01L 23/522* | (2006.01) | |
| *H01L 21/768* | (2006.01) | |
| *H01L 23/48* | (2006.01) | |
| *H01L 23/528* | (2006.01) | |
| *H01L 23/535* | (2006.01) | |

(52) U.S. Cl.
CPC .... *H01L 23/5226* (2013.01); *H01L 21/76898* (2013.01); *H01L 23/481* (2013.01); *H01L 23/5286* (2013.01); *H01L 23/535* (2013.01)

(58) Field of Classification Search
CPC . H01L 23/481; H01L 23/5286; H01L 23/535; H01L 23/485; H01L 21/768–76898; H01L 23/522–53295; H01L 2221/10–1094
See application file for complete search history.

(56) References Cited

U.S. PATENT DOCUMENTS

| | | | |
|---|---|---|---|
| 9,502,351 B1 * | 11/2016 | Sahu | H01L 27/11807 |
| 10,276,499 B2 | 4/2019 | Peng et al. | |
| 2012/0249182 A1 | 10/2012 | Sherlekar | |
| 2020/0025146 A1 | 1/2020 | Sankrithi | |
| 2020/0042668 A1 * | 2/2020 | Peng | H10D 89/10 |
| 2022/0231053 A1 * | 7/2022 | Takeno | H01L 27/11807 |

OTHER PUBLICATIONS

Chava et al., "DTCO Exploration for Efficient Standard Cell Power Rails", Proceedings of SPIE, Mar. 2018, 8 pages.

\* cited by examiner

*Primary Examiner* — Mohammad A Rahman
(74) *Attorney, Agent, or Firm* — David Cain; Andrew M. Calderon; Calderon Safran & Wright P.C.

(57) ABSTRACT

The present disclosure relates to semiconductor structures and, more particularly, to local interconnect power rails merged with upper power rails and methods of manufacture. The structure includes: an active cell including contacts enclosed in active regions; at least one local interconnect power rail connecting to the contacts of the active regions; and at least one power rail above and connected to the at least one local interconnect power rail.

17 Claims, 4 Drawing Sheets

LOCAL INTERCONNECT POWER RAILS AND UPPER POWER RAILS

BACKGROUND

The present disclosure relates to semiconductor structures and, more particularly, to local interconnect power rails merged with upper power rails and methods of manufacture.

Fabricating smaller, more densely packed devices having greater computing capability is a continuing objective in building semiconductor devices. In designing semiconductor devices, each cell of the device requires power input (Vdd) and ground (Vss) connections. To power the various components, each cell is coupled to a power rail which is electrically connected to an active layer of the cell to provide the input power (Vdd). In some instances, a plurality of power rails may be provided for each cell to respectively provide the input power (Vdd) and the ground (Vss).

To improve electromigration (EM) and current/resistance (IR), the power rail width can be increased. This, though, causes area bloat at the cell level. This also results in a decrease in pin density. Alternatively, a second power rail can be added at a higher wiring level. However, this reduces the available routing resources (e.g., routing tracks and via connections) at the wiring levels.

SUMMARY

In an aspect of the disclosure, a structure comprises: a cell comprising contacts enclosed in active regions; at least one local interconnect power rail connecting to the contacts of the active regions; and at least one power rail above and connected to the at least one local interconnect power rail.

In an aspect of the disclosure, a structure comprises: a plurality of cells each of which comprise contacts to active regions adjacent respective gate structures; at least one local interconnect power rail spanning the plurality of cells and connecting to the contacts of the active regions on a same level; and at least one power rail above the at least one local interconnect power rail.

In an aspect of the disclosure, a structure comprises: a cell comprising contacts to active regions adjacent gate structures; a local interconnect power rail spanning over the gate structures and comprising tabs connecting to the contacts on a same level as the contacts; and a power rail above and parallel to the local interconnect power rail, the power rail being on a first wiring layer and connecting to the local interconnect power rail by via connections.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to local interconnect power rails merged with upper power rails and methods of manufacture. More specifically, the present disclosure relates to optimized power rails comprising parallel rail structures. Advantageously, by implementing the different aspects of the present disclosure, it is now possible to achieve a dense standard cell library with improved current/resistance properties (IR) and electromigration (EM) performance compared to single power rail architectures, in addition to increased pin accessibility compared to parallel power rail architectures comprising multiple backend of the line (BEOL) layers.

In more specific embodiments, the structure includes a local interconnect power rail in combination with an upper metal layer power rail. The local interconnect power rail is below the upper metal layer power rail, each of which may be of a minimum width for a particular technology. The local interconnect power rail may include tabs that contact the active regions of the device. The local interconnect power rail and tabs may be coplanar with the active area contacts (e.g., power tabs). Accordingly, no vias are required for connecting the local interconnect power rail to the active regions. In addition, the local interconnect power rail may be merged with power taps on adjacent standard cells to reduce total masks required and to further improve EM/IR performance.

The parallel rail structures of the present disclosure can be manufactured in a number of ways using a number of different tools. In general, though, the methodologies and tools are used to form structures with dimensions in the micrometer and nanometer scale. The methodologies, i.e., technologies, employed to manufacture the parallel rail structures of the present disclosure have been adopted from integrated circuit (IC) technology. For example, the structures are built on wafers and are realized in films of material patterned by photolithographic processes on the top of a wafer. In particular, the fabrication of the parallel rail structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
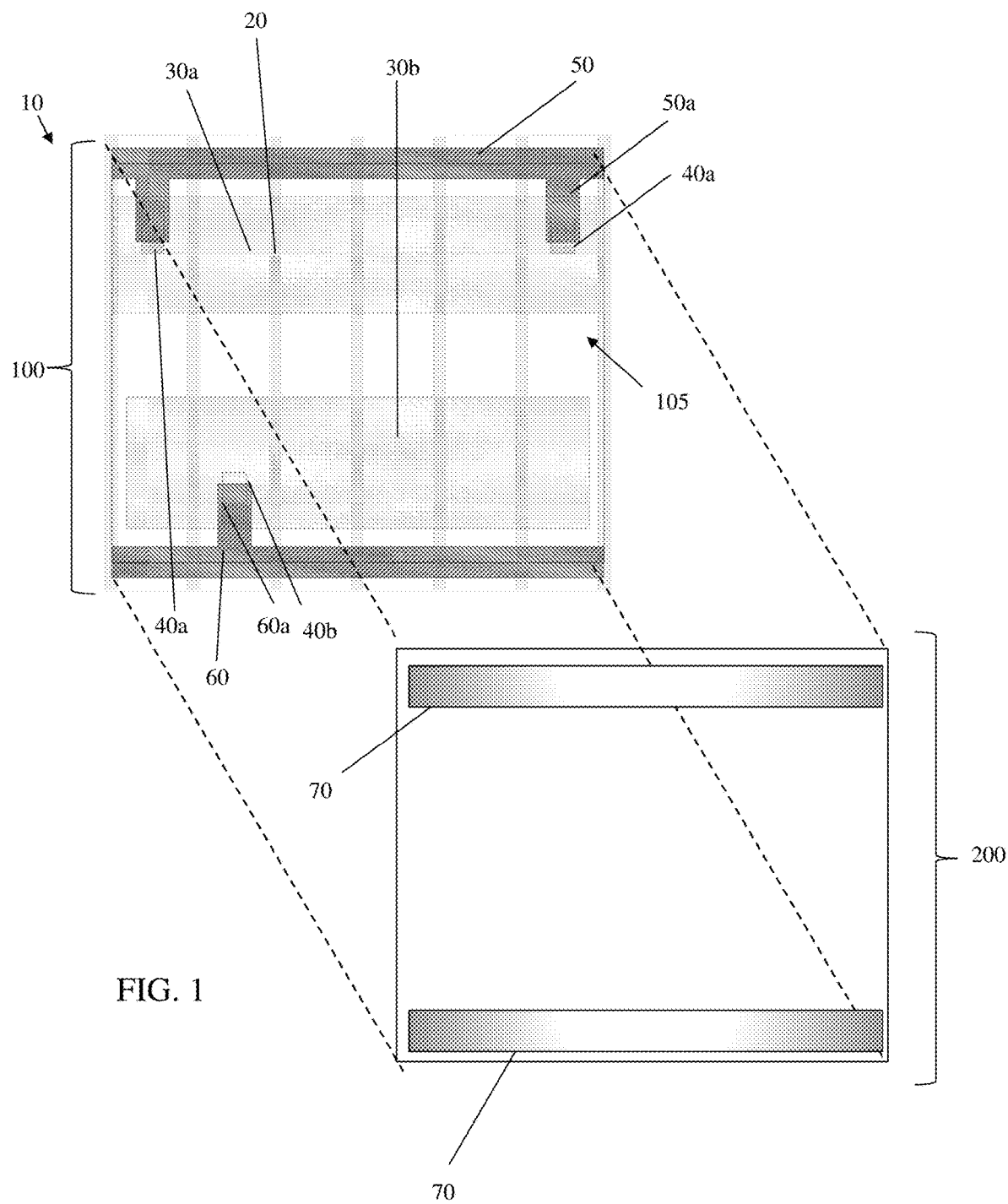
FIG. 1 shows an exploded call layout in accordance with aspects of the present disclosure.

FIG. 1 shows an exploded call layout in accordance with aspects of the present disclosure. More specifically, the structure 10 of FIG. 1 represents different levels 100, 200 of a cell layout with local interconnect power rails 50, 60 and an upper power rail 70 parallel to and over the local interconnect power rails 50, 60.

More specifically, the lower level 100 includes a cell 105 comprising two active regions 30a, 30b with gate structures 20 extending within the active regions 30a, 30b. In embodiments, the gate structures 20 may be polysilicon gate structures and/or finFET structures as is known in the art such that no further explanation is required for a complete understanding of the present disclosure. The finFET structures can be fabricated using, for example, sidewall image transfer (SIT) or self-aligned double patterning (SADP) processes as is known in the art.

The active regions 30a, 30b may be source and drain regions on opposing sides of the gate structures 20. The active regions 30a, 30b may comprise doped semiconductor material as is known in the art. By way of non-limiting example, the doped semiconductor material may be a p+Si material doped with n-type dopants; although other semiconductor material may be contemplated herein. For example, the semiconductor material may be any suitable material including, but not limited to, SiGe, SiGeC, SiC, GaAs, InAs, InP, and other III/V or II/VI compound semiconductors. The doped regions may be formed by conventional ion implantation processes as is known in the art using n-type dopants, e.g., Arsenic (As), Phosphorus (P) and Sb, among other suitable examples.

The active regions 30a, 30b may include contacts (power taps) 40a, 40b. In embodiments, the contacts 40a, 40b may include silicide contacts on the semiconductor material of the active regions 30a, 30b and metal contacts extending to the silicide contacts. The silicide contacts can be fabricated using conventional silicide processes, e.g., deposition of a thin transition metal layer, e.g., nickel, cobalt or titanium, followed by a rapid thermal anneal process. The metal contacts may be formed by conventional lithography, etching and deposition methods known in the art.

As further shown in FIG. 1, the local interconnect power rails 50, 60 extend over the plurality of gate structures 20 and connect to the contacts 40a, 40b. As in each of the embodiments described herein, the local interconnect power rails 50, 60 do not contact the gate structures 20. The local interconnect power rails 50, 60 may also be on a same level as the contacts 40a, 40b, e.g., the contacts 40a, 40b may be coplanar with the local interconnect power rails 50, 60. In embodiments, the local interconnect power rails 50, 60 are below the first wiring level of the device such that the local interconnect power rails 50, 60 will not affect or interfere with contact routing at upper wiring levels. In this way, the location of the local interconnect power rails 50, 60 will not impact the cell design.

As shown in FIG. 1, the local interconnect power rail 60 is provided on active region (NFET) 30b of the cell 105 (VSS); whereas the local interconnect power rail 50 is provided on the active region (PFET) 30a of the cell 105 (VDD). The local interconnect power rails 50, 60 may each include a tab portion 50a, 60a extending to and contacting the respective contacts 40a, 40b. As previously disclosed, as the local interconnect power rails 50, 60 are on a same level as the contacts 40a, 40b, the tab portions 50a, 60a may straddle the respective contacts 40a, 40b (e.g., be coplanar with each other) without concern for punch through risk as is with wider power rails on a first wiring level. Also, the tabs 50a and 60a are both extending into the active region and connecting the source of a device. As should be understood by those of skill in the art, the gate structures 20 extend onto both the active region (NFET) 30b and active region (PFET) 30a of the cell, with source and drain regions on respective sides of the gate structure 20.

The local interconnect power rails 50, 60 may comprise conductive material used in middle of the line (MOL) structures. For example, the local interconnect power rails 50, 60 may be composed of cobalt or tungsten; although other MOL materials may be used depending on the desired performance characteristics. This may include any material depending on its resistivity and EM characteristics. For example, the material may have a higher resistance than backend of the line materials such as copper, i.e., a lower sheet resistivity than material used for the power rail in order to exhibit improved EM characteristics. The local interconnect power rails 50, 60 may be embedded in a dielectric material, e.g., $SiO_2$, and fabricated using conventional lithography, etching and deposition methods, followed by a planarization process, e.g., chemical mechanical polishing (CMP), as is known in the art such that no further explanation is required for a complete understanding of the disclosure.

FIG. 1 further shows power rails 70 on an upper wiring level 200. In embodiments, the power rails 70 are provided on a first wiring level, coincident with the local interconnect power rails 50, 60. That is, in embodiments, the power rails 70 may be laid directly over and parallel to the local interconnect power rails 50, 60. In alternative embodiments, the power rails 70 may be offset from the local interconnects 50, 60. The combination of the power rails 70 and the local interconnect power rails 50, 60 will provide increased current capacity and decreased resistance, hence improving both electromigration (EM) and current/resistance (IR).

Figure 2:
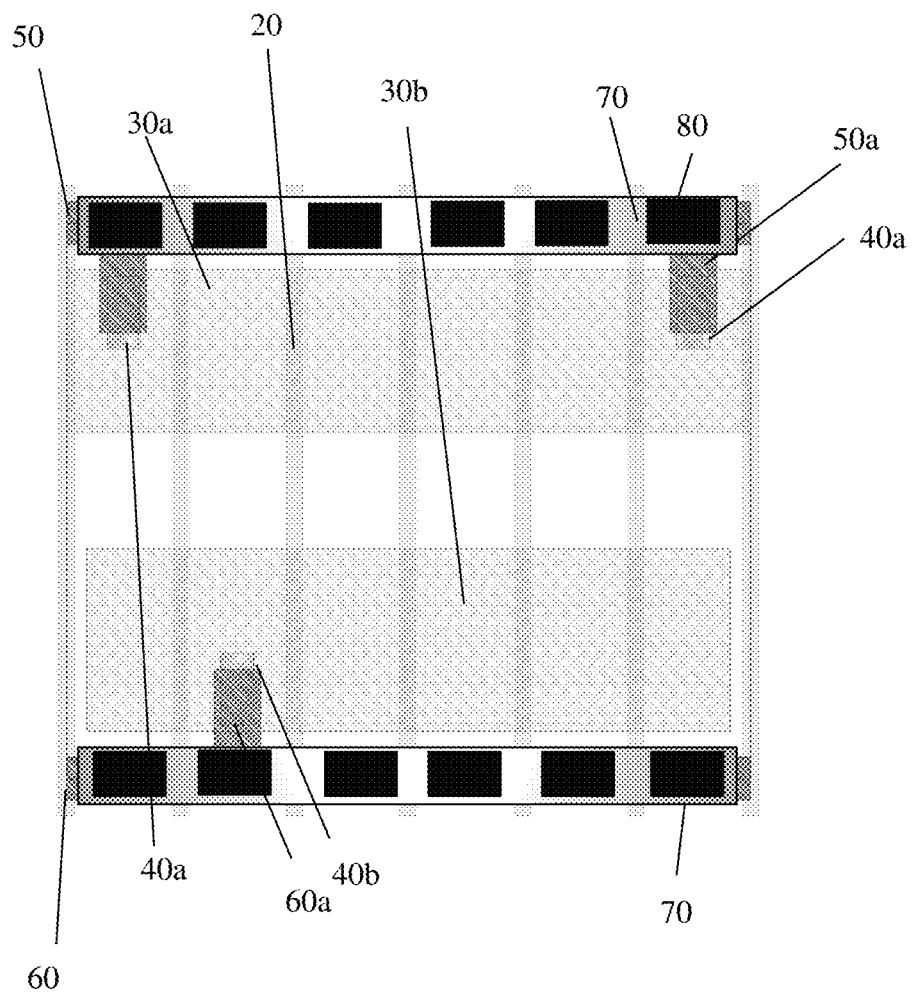
FIG. 2 shows the structure of FIG. 1 integrated into a single layout view in accordance with aspects of the present disclosure.

The power rails 70 may comprise conductive material used in backend of the line (BEOL) structures. For example, the power rails 70 may be composed of copper with an optional TaN or TiN liner. The power rails 70 may be connected to the local interconnect power rails 50, 60 through via interconnects as shown in FIG. 2. The power rails 70 and via interconnects may be a dual damascene structure fabricated using a conventional dual damascene process as is known in the art such that no further explanation is required herein for a complete understanding of the present disclosure.

The power rails 70 may have a wider width profile than the local interconnect power rails 50, 60; although other dimensions are also contemplated herein such as the width of the local interconnect power rails 50, 60 may be equal to or greater than the width of the power rails 70 depending on the specific design parameters. In one preferred embodiment, the width of the local interconnect power rails 50, 60 is equal to the width of the power rails 70. For example, the width of the local interconnect power rails 50, 60 and the power rails 70 may each be about 32 nm based on the pitch of a specific technology node. And, in any dimensional configuration, the combination of the local interconnect power rails 50, 60 and power rail 70 provides improved EM/IR performance compared to a power rail alone.

FIG. 2 shows the structure of FIG. 1 integrated into a single layout view in accordance with aspects of the present disclosure. More specifically, FIG. 2 shows the power rails 70 over the local interconnect power rails 50, 60. In embodiments, the power rails 70 may be connected to the local interconnect power rails 50, 60 by via interconnect structures 80. In embodiments, the via interconnect structures 80 and power rails 70 may be a dual damascene structure comprising the same material. Also, the via interconnect structures 80 may be provided between each of the gate structures 20 or combinations thereof.

As further shown in the layout of FIG. 2, the power rails 70 and the local interconnect power rails 50, 60 have a same width and are parallel to one another. Also, the power rails 70 are directly over the local interconnect power rails 50, 60. And as described above, the combination of the power rails 70 and the local interconnect power rails 50, 60 will increase the current density limit (due to an increase in metal volume) compared to only the use of power rails 70. This is due to the fact that the power rail current can be split between the power rails 70 and the local interconnect power rails 50, 60 effectively reducing the current in the power rails 70 and, hence, enabling a larger EM limit.

Figure 3:
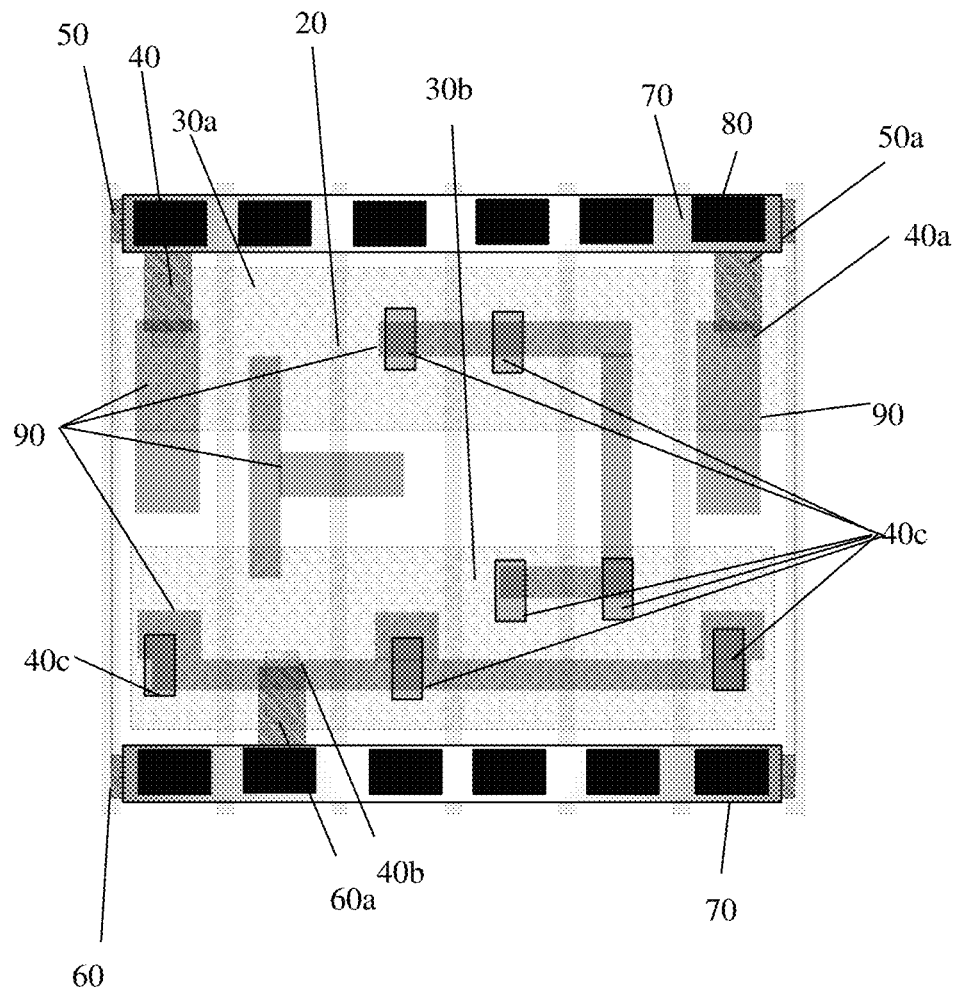
FIG. 3 shows the structure of FIG. 2 with pin connections and other backend of the line (BEOL) structures in accordance with aspects of the present disclosure.

FIG. 3 shows the structure of FIG. 2 with pin connections and other BEOL structures in accordance with aspects of the present disclosure. The structure of FIG. 3 is shown as a non-limiting example illustrating that the local interconnect power rails 50, 60 will not interfere with the layout of additional elements, e.g., drain/source contacts 40*c* and upper wiring structures 90. Specifically, as the local interconnect power rails 50, 60 are below the first wiring level, i.e., power rails 70, they will not affect or interfere with contact routing of drain/source contacts 40*c*, upper wiring structures 90 or other BEOL structures in upper wiring layers. In this way, FIG. 3 illustrates that the location of the local interconnect power rails 50, 60 does not impact the cell design.

Figure 4:
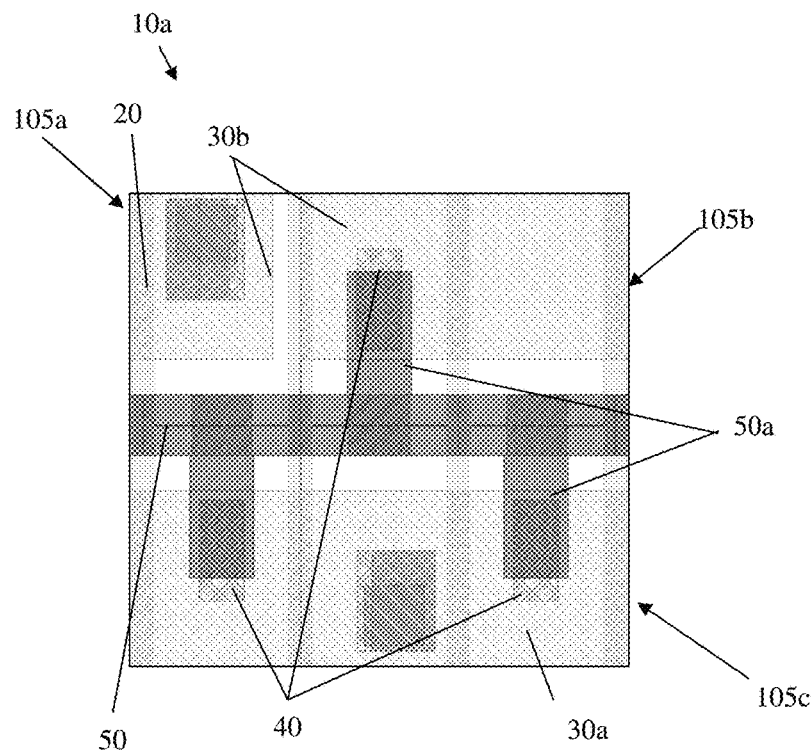
FIG. 4 shows a local interconnect power rail with power taps on adjacent vertical cell rows in accordance with aspects of the present disclosure.

FIG. 4 shows a local interconnect power rail merged with the power taps on adjacent cells. More specifically, the structure 10*a* of FIG. 4 includes several adjacent cells 105*a*, 105*b*, 105*c* each with active regions 30*a*, 30*b* and gate structures 20 straddling between the cells. The cells 105*a*, 105*b* are horizontally adjacent to one another and vertically adjacent to the cell 105*c*. The active regions 30*a*, 30*b* each include contacts 40. A single local interconnect power rail 50 with tab portions 50*a* will contact respective contacts on the active regions 30*a*, 30*b* of respective cells 105*b*, 105*c*. In this way, a single local interconnect power rail 50 may merge with the power taps, e.g., contacts 40, on adjacent cells to reduce total masks required and further improve EM/IR. Also, as in each of the embodiments, the single local interconnect power rail 50 may be coplanar with the contacts 40 and, hence, not require any via interconnects.

Figure 5:
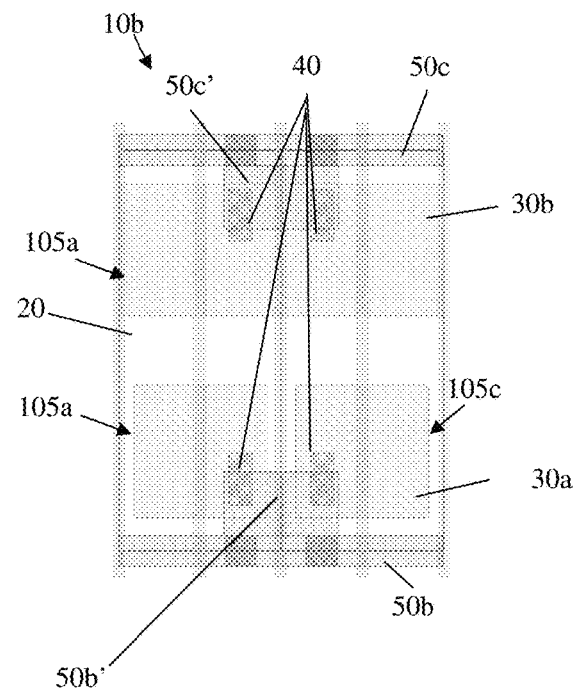
FIG. 5 shows a local interconnect power rail with a merged tab connecting to multiple power taps on a same cell and adjacent cells in accordance with aspects of the present disclosure.

FIG. 5 shows a local interconnect power rail with a merged tab connecting to power taps on a same cell and adjacent cells. More specifically the structure 10*b* of FIG. 5 includes several adjacent cells 105*a*, 105*c* each with active regions 30*a*, 30*b* and gate structures 20 straddling between the cells. As should be understood by those of skill in the art, the upper portion of the cell 105*a* denotes a PFET region and the lower portion of the cell 105*a* denotes an NFET region of the cell. And the cell 105*c* is a separate cell adjacent to the cell containing the active regions 105*a*, 105*b*.

The active regions 30*a*, 30*b* each include multiple contacts 40. A single local interconnect power rail 50*c* with a merged tab portion 50*c'* will contact the respective contacts 40 of cells 105*a*. In addition, a single local interconnect power rail 50*b* with a merged tabbed portion 50*b'* may contact the respective contacts 40 of adjacent cells 105*b*, 105*c*. In this way, a single local interconnect power rail may merge with multiple power taps, e.g., multiple contacts 40, on a single cell or adjacent cells to reduce total masks required and to further improve EM/IR. As in each of the embodiments, the single local interconnect power rails 50*b*, 50*c* will be coplanar with the contacts 40 and, hence, not require any via interconnects.

The local interconnect power rails can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a cell comprising contacts enclosed in active regions, wherein the active region includes gate structures;
at least one local interconnect power rail connecting to the contacts of the active regions, the at least one local interconnect power rail positioned over and orthogonal to the gate structures;
at least one power rail above and connected to the at least one local interconnect power rail, the at least one power rail parallel to the at least one local interconnect power rail and positioned over and orthogonal to the gate structures,
wherein the at least one local interconnect power rail and the at least one power rail comprise a same width.

2. The structure of claim 1, wherein the at least one local interconnect power rail is coplanar with the contacts of the active regions.

3. The structure of claim 1, wherein the at least one local interconnect power rail is connected to the at least one power rail above by via interconnect structures.

4. The structure of claim 1, wherein the at least one local interconnect power rail is located below a first wiring layer.

5. The structure of claim 1, wherein the at least one local interconnect power rail straddles a gate structure adjacent to the active regions.

6. The structure of claim 1, wherein the least one local interconnect power rail comprises a first local interconnect power rail over the active region of an NFET and a second local interconnect power rail over the active region of a PFET, the first and second local interconnect power rails further comprise tabs which straddle the active regions on a coplanar level with the first and second interconnect power rails, and the first and second local interconnect power rails are on a same level as contacts which connect to the tabs.

7. The structure of claim 6, wherein a single or multiple tab(s) connects to single or multiple contact(s) across adjacent cells.

8. The structure of claim 1, wherein the at least one local interconnect power rail and the at least one power rail are parallel to one another.

9. The structure of claim 1, wherein the at least one local interconnect power rail and the at least one power rail comprise different widths that overlap with one another.

10. The structure of claim 1, wherein the at least one local interconnect power rail staddles multiple cells and connects to contacts in active regions on each of the multiple cells.

11. The structure of claim 10, wherein the multiple cells are one of vertically adjacent to one another and horizontally adjacent to one another.

12. A structure comprising:
a cell comprising contacts enclosed in active regions, wherein the active region includes gate structures;
at least one local interconnect power rail connecting to the contacts of the active regions, the at least one local interconnect power rail positioned over and orthogonal to the gate structures;
at least one power rail above and connected to the at least one local interconnect power rail, the at least one power rail parallel to the at least one local interconnect power rail and positioned over and orthogonal to the gate structures,
wherein the least one local interconnect power rail comprises a first local interconnect power rail over the active region of an NFET and a second local interconnect power rail over the active region of a PFET, the first and second local interconnect power rails further comprise tabs which straddle the active regions on a coplanar level with the first and second interconnect power rails, and the first and second local interconnect power rails are on a same level as contacts which connect to the tabs and
wherein a single or multiple tab(s) connects to single or multiple contact(s) on a single cell or across adjacent cells.

13. A structure comprising:
a plurality of cells each of which comprise contacts to active regions adjacent respective gate structures;
at least one local interconnect power rail spanning the plurality of cells and connecting to the contacts of the active regions on a same level and orthogonal to the respective gate structures; and
at least one power rail above the at least one local interconnect power rail, the at least one power rail being parallel with the at least one local interconnect power rail and orthogonal to the respective gate structures, wherein the least one local interconnect power rail comprises a tab which connects to multiple contacts on the same level, and
a single tab connects to multiple contacts on one of a single cell and across adjacent cells, and wherein the least one local interconnect power rail comprises a first local interconnect power rail over an active region of an NFET and a second local interconnect power rail over an active region of a PFET, the first and second local interconnect power rails being on a same level as contacts which connect to the single tab.

14. The structure of claim 13, wherein the at least one power rail comprises a dual damascene structure with via interconnects connecting to the at least one local interconnect power rail.

15. The structure of claim 14, wherein the at least one local interconnect power rail is located below a first wiring layer and straddles over the gate structures adjacent to the active regions.

16. The structure of claim 15, wherein the via interconnects are located between the gate structures.

17. A structure comprising:
a cell comprising contacts to active regions adjacent gate structures;
a local interconnect power rail spanning over the gate structures and comprising tabs connecting to the contacts on a same level as the contacts, the local interconnect power rail being perpendicular to the adjacent gate structures; and
a power rail above, in alignment and parallel to the local interconnect power rail, the power rail being on a first wiring layer and connecting to the local interconnect power rail by via connections, the power rail being perpendicular to the adjacent gate structures, wherein:
the tabs include silicide contacts on semiconductor material of the active regions and metal contacts extending to the silicide contacts;
the local interconnect power rails extend over the gate structures and connect to the tabs;
the local interconnect power rail does not contact the gate structures;
the local interconnect power rail is on a same level as the tabs such that the tabs and the local interconnect power rail are coplanar; and
the local interconnect power rail are below a first wiring level such that the local interconnect power rail does not interfere with contact routing at upper wiring levels.

* * * * *